United States Patent
Lee

(10) Patent No.: US 7,339,851 B2
(45) Date of Patent: *Mar. 4, 2008

(54) WORD LINE DRIVING CIRCUIT OF SEMICONDUCTOR MEMORY DEVICE

(75) Inventor: Jong Chern Lee, Cheongju-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/618,984

(22) Filed: Jan. 2, 2007

(65) Prior Publication Data

US 2007/0109868 A1   May 17, 2007

Related U.S. Application Data

(63) Continuation of application No. 11/126,677, filed on May 11, 2005, now Pat. No. 7,177,226.

(30) Foreign Application Priority Data

Nov. 15, 2004   (KR) .............................. 2004-93177

(51) Int. Cl.
*G11C 8/00* (2006.01)
(52) U.S. Cl. .......................... 365/230.06; 365/185.23; 365/195
(58) Field of Classification Search .......... 365/230.06, 365/185.23, 191, 195, 185.24
See application file for complete search history.

(56) References Cited

U.S. PATENT DOCUMENTS

| | | | |
|---|---|---|---|
| 4,954,731 A | 9/1990 | Dhong et al. | |
| 5,075,571 A | 12/1991 | Dhong et al. | |
| 5,297,104 A | 3/1994 | Nakashima | |
| 5,363,338 A | 11/1994 | Oh | |
| RE35,750 E | 3/1998 | Casper et al. | |
| 5,761,135 A | 6/1998 | Lee | |
| 5,818,790 A | 10/1998 | Kim et al. | |
| 5,923,609 A | 7/1999 | Roscher et al. | |
| 6,249,477 B1 * | 6/2001 | Ohtsuki | 365/230.06 |
| 6,337,831 B1 | 1/2002 | Nam | |
| 6,477,105 B2 * | 11/2002 | Aritomi et al. | 365/230.03 |
| 6,542,432 B2 | 4/2003 | Sim | |
| 6,545,923 B2 | 4/2003 | Sim et al. | |
| 6,646,949 B1 | 11/2003 | Ellis et al. | |
| 7,075,852 B2 | 7/2006 | Dono et al. | |
| 7,177,226 B2 | 2/2007 | Lee | |

* cited by examiner

*Primary Examiner*—Richard T. Elms
*Assistant Examiner*—Toan Le
(74) *Attorney, Agent, or Firm*—Marshall, Gerstein & Borun LLP

(57) ABSTRACT

Disclosed herein is a word line driving circuit in which sub-word lines are prevented from floating by using a sub-word line driver having two transistors. A plurality of sub-word line drivers is connected to one main word line. Each of the plurality of the sub-word lines includes a PMOS transistor and a NMOS transistor serially connected between a sub-word line driving voltage FX and a ground voltage. A floating prevention unit selects the main word line to a level of a threshold voltage using a driving signal having the level of the threshold voltage, thus preventing sub-word lines of a sub-word line driver, where the sub-word line driving voltage FX is off, from floating.

20 Claims, 3 Drawing Sheets

VSS Leak=within 10uA

VSS Leak=within 10uA

WORD LINE DRIVING CIRCUIT OF SEMICONDUCTOR MEMORY DEVICE

CROSS-REFERENCE TO RELATED APPLICATIONS

This patent is a continuation of U.S. Ser. No. 11/126,677 filed May 11, 2005, and issued as U.S. Pat. No. 7,177,226 on Feb. 13, 2007, the disclosure of which is hereby expressly incorporated for all purposes.

BACKGROUND

1. Technical Field

A word line driving circuit is disclosed in which sub-word lines are prevented from floating by using a sub-word line driver having two transistors.

2. Discussion of Related Art

FIG. 1 is a circuit diagram showing a conventional word line driver. The word line driver includes a main word line driver 110, and eight sub-word line drivers 120 to 190. The eight sub-word line drivers 120 to 190 are controlled by one main word line MWL0.

Referring to FIG. 1, the main word line driver 110 includes a PMOS transistor P1 and a NMOS transistor N1. The PMOS transistor P1 has one end connected to a high voltage VPP, and the other end connected to the main word line MWL0. The PMOS transistor P1 has a gate applied with signal DR, and thus operates. The NMOS transistor N1 has one end connected to a ground voltage, the other end connected to the main word line MWL0, and operates according to the driving signal DR.

Each of the eight sub-word line drivers 120 to 190 includes a PMOS transistor P2 and two NMOS transistors N2, N3. The PMOS transistor P2 has one end connected to a sub-word line driving voltage FX0, the other end connected to a sub-word line SWL0, and a gate connected to the main word line MWL0. The NMOS transistor N2 has one end connected to a ground voltage, the other end connected to the sub-word line SWL0, and a gate connected to the main word line MWL0. The NMOS transistor N3 has one end connected to the ground voltage, the other end connected to the sub-word line SWL0, and a gate connected to a sub-word line driving voltage FX0B. The NMOS transistor N3 is provided to prevent the sub-word line SWL0 from floating.

As such, if the eight sub-word line drivers 120 to 190 are connected to one main word line, since each of the sub-word line drivers 120 to 190 consists of three transistors. Therefore, the lines of 16 sub-word line driving voltages FX, FXB are required which results in a layout size of the sub-word line driver that is bulky.

SUMMARY OF THE DISCLOSURE

Accordingly, in view of the above layout and complexity problems, a word line driving circuit is disclosed in which a sub-word line driver having only two transistors is constructed, thereby reducing the layout size.

A disclosed word line driving circuit, in which sub-word lines are prevented from floating by using a floating prevention unit connected to one main word line and a sub-word line driver, consists of only two transistors.

In an embodiment, a word line driving circuit of a semiconductor memory device comprises a main word line driver connected to one main word line, a plurality of sub-word line drivers connected to the one main word line, and a floating prevention unit for selecting the main word line to a level of a threshold voltage in response to a driving signal having the level of the threshold voltage, thereby preventing each of sub-word lines of the plurality of the sub-word line drivers.

A semiconductor memory device is disclosed in which a main word line driver is connected to one main word line, and a plurality of sub-word line drivers are connected to the one main word line, including a floating prevention unit for selecting the main word line to a level of a threshold voltage in response to a driving signal having the level of the threshold voltage, thereby preventing each of sub-word lines of the plurality of the sub-word line drivers, wherein each of the plurality of the sub-word line drivers includes first and second driving elements, which are serially connected between a sub-word line driving voltage and a ground voltage, and drive the sub-word lines.

DETAILED DESCRIPTION OF PREFERRED EMBODIMENTS

Figure 1:
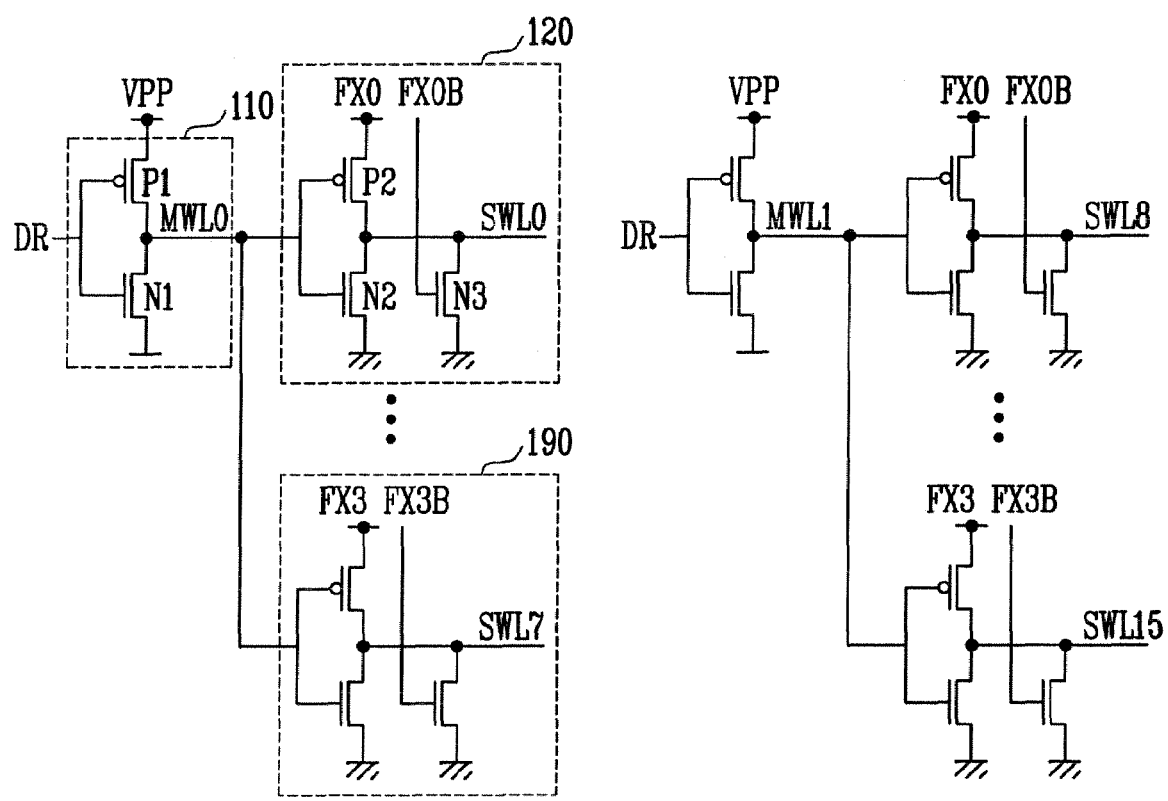
FIG. 1 is a circuit diagram showing a conventional word line driving circuit.
Figure 2:
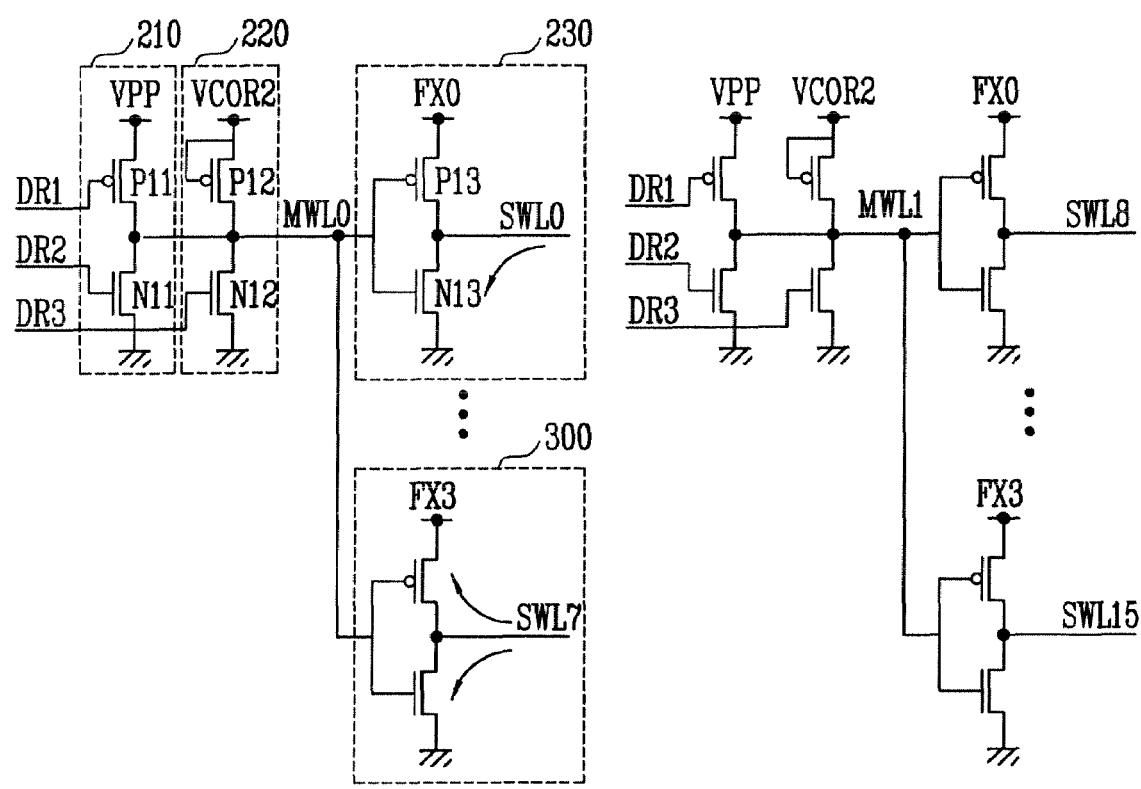
FIG. 2 is a circuit diagram showing a word line driving circuit according to a preferred embodiment.

Now, preferred embodiments will be described with reference to the accompanying drawings. FIG. 2 is a circuit diagram showing a preferred word line driving circuit.

Referring to FIG. 2, the word line driving circuit includes a main word line driver 210, a floating prevention unit 220, and sub-word line drivers 230 to 300.

The main word line driver 210 serves to drive a main word line MWL0, and includes one PMOS transistor P11 and one NMOS transistor N11. The PMOS transistor P11 has one end connected to a high voltage VPP, and the other end connected to the main word line MWL0. The PMOS transistor P11 has a gate applied with a driving signal DR1. The NMOS transistor N11 has one end connected to a ground voltage, and the other connected to the main word line MWL0. The NMOS transistor N11 has a gate applied with a driving signal DR2, and thus operates.

The floating prevention unit 220 serves to leak electric charges (current), which are charged into non-selected sub-word lines among a plurality of sub-word lines SWL0 to SWL7 connected to a selected main word line MWL0, toward a ground voltage VSS. The floating prevention unit 220 includes one PMOS diode transistor P12 and one NMOS transistor N12. The PMOS diode transistor P12 has one end connected to a core voltage VCOR2, the other end connected to the main word line MWL0, and a gate connected to the core voltage VCOR2. The NMOS transistor N12 has one end connected to the ground voltage, the other end connected to the main word line MWL0, and a gate applied with a driving signal DR3.

The sub-word line drivers 230 to 300 serve to drive the sub-word lines SWL0 to SWL7. The sub-word line driver 230 includes one PMOS transistor P13 and one NMOS transistor N14. The PMOS transistor P13 has one end connected to a sub-word line driving voltage FX0, the other end connected to the sub-word line SWL0, and a gate connected to the main word line MWL0. The NMOS transistor N13 has one end connected to a ground voltage, the other end connected to the sub-word line SWL0, and a gate connected to the main word line MWL0.

Hereinafter, the operation of a disclosed word line driver will be described.

In the main word line driver 210, the PMOS transistor P11 is turned off by means of the driving signal DR1, and thus blocks current from flowing into the main word line MWL0. The NMOS transistor N11 is turned on for a predetermined period by means of the driving signal D2, and thus leaking electric charges (current) charged into the main word line MWL0 toward the ground voltage VSS.

In the floating prevention unit 220, the NMOS transistor N12 is turned on by the driving signal DR3, which is activated simultaneously with the driving signal DR1. The driving signal DR3 turns on the NMOS transistor N12 with a voltage level of around a threshold voltage Vt, which is lower than a voltage level of the driving signal DR2. The PMOS diode transistor P12 functions to allow the main word line MWLO to have a level of around the threshold voltage Vt, when the NMOS transistor N12 is turned on. That is, the PMOS diode transistor P12 allows the main word line MWL0 to have a level of around the threshold voltage Vt by properly controlling a turn-on resistance ratio of the PMOS transistor P13 and the NMOS transistor N13.

As such, if the main word line MWL0 becomes a level of about the threshold voltage Vt, and the sub-word line driving voltage FX0 is selected (on) as a High level, the sub-word line SWL0 is driven as a High level. In other words, since the main word line MWL0 is selected (on) at about the threshold voltage Vt and the NMOS transistor N13 is slightly turned on, the current, which leaks from the sub-word line SWL0 that is at a High level to the ground voltage VSS through the NMOS transistor N13 of the sub-word line driver 230, is controlled and minimized.

Furthermore, by selecting the NMOS transistor N12 and the PMOS transistor P12 whose size is several times smaller than that of the NMOS transistor N11 and the PMOS transistor P11, it is possible to permit a leak current of a small amount toward the ground voltage VSS only, and in only floated sub-word lines with having less influence on sub-word lines in a normal operation.

Figure 3A:
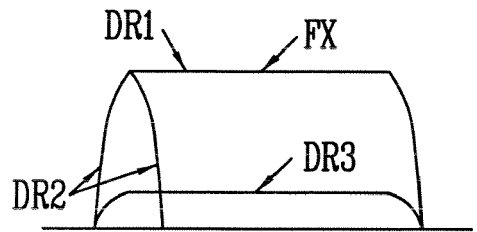
FIGS. 3a to 3c shows signals of FIG. 2 and waveforms of main word lines and sub-word lines selected accordingly.
Figure 3B:
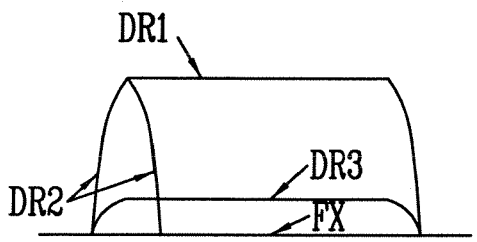
Figure 3C:
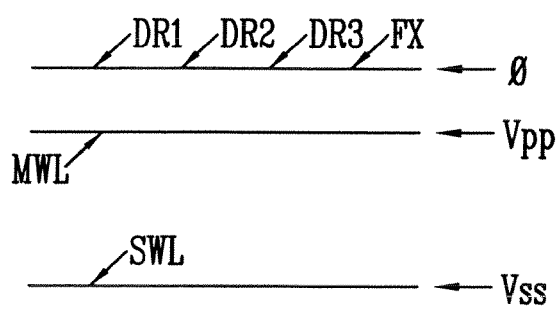

FIGS. 3a to 3c show disclosed driving signals DR1, DR2 and DR3 and disclosed sub-word line driving voltage FX, which are input to the word line driver, and a waveform of the main word line MWL and the sub-word line SWL.

A case where the main word line MWL, the sub-word line driving voltage FX, and the sub-word line SWL belong to one of the following four cases will be first described.

First, if the main word line MWL is selected (on) as a Low level and the sub-word line driving voltage FX is selected (on) as a High level, the sub-word line SWL is selected (on) a high voltage VPP.

Second, if the main word line MWL is selected (on) as a Low level and the sub-word line driving voltage FX is not selected (off) as a Low level, the sub-word line SWL is selected (on) as a threshold voltage Vt.

Third, if the main word line MWL is not selected (off) as a High level and the sub-word line driving voltage FX is selected (on) as a High level, the sub-word line SWL is not selected (off) as a ground voltage VSS.

Fourth, if the main word line MWL is not selected (off) as a High level and the sub-word line driving voltage FX is not selected (off) as a Low level, the sub-word line SWL is not selected (off) as a ground voltage VSS.

FIG. 3a shows a waveform of a case where as the main word line MWL is selected (on) as a Low level and the sub-word line driving voltage FX is selected (on) as a High level, the sub-word line SWL is selected (on) as a high voltage VPP.

FIG. 3b shows a waveform of a case where as the main word line MWL is selected (on) as a Low level and the sub-word line driving voltage FX is not selected (off) as a Low level, the sub-word line SWL is not selected (off).

In FIG. 3b, in order to prevent the sub-word line SWL from floating, i.e., in order to make not-selected (off) sub-word lines the ground voltage VSS, the NMOS transistor N13 of the sub-word line driver 230 is turned on slightly by lowering the main word line MWL0 down to the level of around the threshold voltage Vt not the ground voltage VSS (see FIG. 2). By doing so, electric charges (current) in floated sub-word lines, which are charged by surrounding coupling, are leaked toward the ground voltage VSS. Thus, non-selected sub-word lines are prevented from rising over the ground voltage VSS.

FIG. 3c shows a waveform of a case where as the main word line MWL is not selected (off) as a High level and the sub-word line driving voltage FX is not selected (off) as a Low level, the sub-word line SWL is not selected (off) as a ground voltage VSS.

That is, FIG. 3c show a case where the PMOS transistor P13 and the NMOS transistor N13 of the sub-word line driver 230 are completely turned off, and non-selected sub-word lines are thus fixed to the ground voltage VSS.

As described above, although a sub-word line driver is composed of only two transistors, sub-word lines where a sub-word line driving signal FX is not turned on, among main word lines selected through a floating prevention unit connected to the main word lines, are prevented from floating.

Furthermore, in the prior art, if eight sub-word lines are connected every one main word line, a sub-word line driver is composed of three transistors. Thus, lines of 16 sub-word line driving voltages FX, FXB are needed. In contrast, if eight sub-word lines are connected every one main word line as disclosed herein, a disclosed sub-word line driver can be composed of only two transistors. Thus, only lines of eight sub-word line driving voltage FX are needed. Accordingly, the disclosed word line driving circuit can significantly cut down on the layout area of the sub-word line driver compared to the prior art, and can reduce the overall hip size accordingly.

Although the foregoing description has been made with reference to the preferred embodiments, it is to be understood that changes and modifications may be made by one of ordinary skill in the art without departing from the spirit and scope of this disclosure and the appended claims.

What is claimed is:

1. A word line driving circuit comprising:
a main word line driver connected to a main word line;
a plurality of sub-word line drivers connected to the main word line and including each sub-word line; and
a floating prevention unit for preventing the sub-word line of a non-selected sub-word line driver among the plurality of sub-word line drivers from floating in response to a driving signal.

2. The word line driving circuit as claimed in claim 1, wherein each of the plurality of the sub-word line drivers comprises first and second driving elements, which are serially connected between a sub-word line driving voltage terminal and a ground voltage terminal, and drives the sub-word lines.

3. The word line driving circuit as claimed in claim 2, wherein the floating prevention unit prevents the sub-word lines of the sub-word line driver, where the sub-word line driving voltage is off, from floating.

4. The word line driving circuit as claimed in claim 1, wherein the floating prevention unit connects the sub-word line of the non-selected sub-word line driver to the ground voltage terminal.

5. The word line driving circuit as claimed in claim 4, wherein the driving signal is input as a level of the threshold voltage.

6. The word line driving circuit as claimed in claim 4, wherein the floating prevention unit selects the main word line to a level of the threshold voltage so that electric charges charged into the sub-word lines leak toward the ground voltage terminal, thereby preventing the sub-word lines from floating.

7. The word line driving circuit as claimed in claim 1, wherein the floating prevention unit comprises:
    a first transistor that is turned on by the driving signal having a level of the threshold voltage; and
    a second transistor for allowing the main word line to become the level of the threshold voltage if the first transistor is turned on.

8. The word line driving circuit as claimed in claim 7, wherein the first and second transistors have the size, which is several times smaller than that of components of the main word line driver.

9. The word line driving circuit as claimed in claim 7, wherein the first transistor has one end connected to the main word line and the other end connected to the ground voltage terminal, and is driven by the driving signal having the level of the threshold voltage, and the second transistor has one end connected to a core voltage and the other connected to the main word line, and where the core voltage is applied to a gate.

10. The word line driving circuit as claimed in claim 5, wherein the first transistor is a NMOS transistor, and the second transistor is a PMOS diode transistor.

11. A word line driving circuit comprising:
    a main word line driver connected to a main word line;
    a plurality of sub-word line drivers connected to the main word line and including each sub-word line; and
    a floating prevention unit for controlling a voltage level of the main word line in order to prevent the sub-word line from floating in response to a driving signal.

12. The word line driving circuit as claimed in claim 11, wherein the floating prevention unit controls the voltage level of the main word line to the level of the threshold voltage in order to prevent the sub-word line from floating.

13. The word line driving circuit as claimed in claim 11, wherein each of the plurality of the sub-word line drivers comprises first and second driving elements, which are serially connected between a sub-word line driving voltage terminal and a ground voltage terminal, and drives the sub-word lines.

14. The word line driving circuit as claimed in claim 13, wherein the floating prevention unit connects the sub-word line of the non-selected sub-word line driver among the sub-word line drivers to the ground voltage terminal in response to the driving signal that is input as the level of the threshold voltage.

15. The word line driving circuit as claimed in claim 13, Wherein the floating prevention unit connects the sub-word line of the sub-word line driver connected to the sub-word line driving voltage terminal where the sub-word line driving voltage is turned off to the ground voltage terminal.

16. The word line driving circuit as claimed in claim 11, wherein the floating prevention unit selects the main word line to a level of the threshold voltage so that electric charges charged into the sub-word lines leak toward a ground voltage, thereby preventing the sub-word lines from floating.

17. The word line driving circuit as claimed in claim 11, wherein the floating prevention unit comprises:
    a first transistor that is turned on by the driving signal having the level of the threshold voltage; and
    a second transistor for allowing the main word line to become the level of the threshold voltage if the first transistor is turned on.

18. The word line driving circuit as claimed in claim 17, wherein the first and second transistors has the size, which is several times smaller than that of components of the main word line driver.

19. The word line driving circuit as claimed in claim 17, wherein the first transistor has one end connected to the main word line and the other end connected to a ground voltage, and is driven by the driving signal having the level of the threshold voltage, and the second transistor has one end connected to a core voltage and the other connected to the main word line.

20. The word line driving circuit as claimed in claim 17, wherein the first transistor is a NMOS transistor, and the second transistor is a PMOS diode transistor.

* * * * *